United States Patent
Arneson et al.

(10) Patent No.: US 7,543,316 B2
(45) Date of Patent: Jun. 2, 2009

(54) ANTENNA DESIGNS FOR RADIO FREQUENCY IDENTIFICATION TAGS

(75) Inventors: Michael R. Arneson, Westminister, MD (US); William R. Bandy, Gambrills, MD (US); Wayne Shanks, Baltimore, MD (US); Hai Tran, Aldie, VA (US)

(73) Assignee: Symbol Technologies, Inc., Holtsville, NY (US)

( * ) Notice: Subject to any disclaimer, the term of this patent is extended or adjusted under 35 U.S.C. 154(b) by 449 days.

(21) Appl. No.: 11/393,887

(22) Filed: Mar. 31, 2006

(65) Prior Publication Data

US 2006/0174257 A1 Aug. 3, 2006

Related U.S. Application Data

(63) Continuation of application No. 10/866,151, filed on Jun. 14, 2004, now Pat. No. 7,404,199.

(60) Provisional application No. 60/477,735, filed on Jun. 12, 2003.

(51) Int. Cl.
*G11B 7/24* (2006.01)

(52) U.S. Cl. .................................................. 720/718
(58) Field of Classification Search ................. 720/718; 118/723 E; 705/18; 340/10.42, 572.7; 343/793, 343/809, 895; 438/106
See application file for complete search history.

(56) References Cited

U.S. PATENT DOCUMENTS

| | | | | |
|---|---|---|---|---|
| 6,868,800 | B2 * | 3/2005 | Moroz ................... | 118/723 E |
| 6,891,515 | B1 * | 5/2005 | Langley et al. ............. | 343/895 |
| 7,363,642 | B2 * | 4/2008 | Oshima et al. ............. | 720/718 |
| 7,378,971 | B2 * | 5/2008 | Andrechak et al. ........ | 340/572.7 |
| 2003/0197653 | A1 * | 10/2003 | Barber et al. ............... | 343/742 |
| 2003/0231107 | A1 * | 12/2003 | Edmonson et al. ....... | 340/10.42 |
| 2004/0054594 | A1 * | 3/2004 | Forster et al. ................. | 705/18 |
| 2004/0125040 | A1 * | 7/2004 | Ferguson et al. ............ | 343/895 |
| 2004/0203185 | A1 * | 10/2004 | Kerr et al. ................... | 438/106 |
| 2004/0217865 | A1 * | 11/2004 | Turner ..................... | 340/572.7 |
| 2005/0040994 | A1 * | 2/2005 | Mazoki et al. ............. | 343/809 |
| 2007/0040689 | A1 * | 2/2007 | Reynolds ................. | 340/572.7 |
| 2007/0152901 | A1 * | 7/2007 | Hockey et al. ............. | 343/793 |

* cited by examiner

*Primary Examiner*—Tianjie Chen

(57) ABSTRACT

Methods, systems, and apparatuses for antenna designs for radio frequency identification (RFID) tags are described.

10 Claims, 6 Drawing Sheets

US 7,543,316 B2

ANTENNA DESIGNS FOR RADIO FREQUENCY IDENTIFICATION TAGS

CROSS-REFERENCE TO RELATED APPLICATIONS

This application is a continuation of U.S. application Ser. No. 10/866,151, filed Jun. 14, 2004, now U.S. Pat. No. 7,404, 199, which claims the benefit of U.S. Provisional Application No. 60/477,735, filed Jun. 12, 2003, both of which are herein incorporated by reference in their entireties.

BACKGROUND OF THE INVENTION

1. Field of the Invention

The present invention relates generally to antenna designs for radio frequency identification (RFID) tags.

2. Related Art

Pick and place techniques are often used to assemble electronic devices. Such techniques involve a manipulator, such as a robot arm, to remove integrated circuit (IC) dies from a wafer and place them into a die carrier. The dies are subsequently mounted onto a substrate with other electronic components, such as antennas, capacitors, resistors, and inductors to form an electronic device.

Pick and place techniques involve complex robotic components and control systems that handle only one die at a time. This has a drawback of limiting throughput volume. Furthermore, pick and place techniques have limited placement accuracy, and have a minimum die size requirement One type of electronic device that may be assembled using pick and place techniques is an RFID "tag." An RFID tag may be affixed to an item whose presence is to be detected and/or monitored. The presence of an RFID tag, and therefore the presence of the item to which the tag is affixed, may be checked and monitored by devices known as "readers."

As market demand increases for products such as RFID tags, and as die sizes shrink, high assembly throughput rates for very small die, and low production costs are crucial in providing commercially-viable products. Accordingly, what is needed is an electronic device, such as an RFID tag, that overcomes these limitations.

SUMMARY OF THE INVENTION

The present invention is directed to methods, systems, and apparatuses for producing one or more electronic devices, such as RFID tags, that each include a die having one or more electrically conductive contact pads that provide electrical connections to related electronics on a substrate.

According to the present invention, electronic devices are formed at much greater rates than conventionally possible. In one aspect, large quantities of dies can be transferred directly from a wafer to corresponding substrates of a web of substrates. In another aspect, large quantities of dies can be transferred from a support surface to corresponding substrates of a web of substrates. In another aspect, large quantities of dies can be transferred from a wafer or support surface to an intermediate surface, such as a die plate. The die plate may have cells formed in a surface thereof in which the dies reside. Otherwise, the dies can reside on a surface of the die plate. The dies of the die plate can then be transferred to corresponding substrates of a web of substrates.

In an aspect, a punch plate, punch roller or cylinder, or expandable material can be used to transfer dies from the die plate to substrates.

Large quantities of dies can be transferred. For example, 10s, 100s, 1000s, or more dies, or even all dies of a wafer, support surface, or die plate, can be simultaneously transferred to corresponding substrates of a web.

In one aspect, dies may be transferred between surfaces in a "pads up" orientation. When dies are transferred to a substrate in a "pads up" orientation, related electronics can be printed or otherwise formed to couple contact pads of the die to related electronics of the tag substrate.

In an alternative aspect, the dies may be transferred between surfaces in a "pads down" orientation. When dies are transferred to a substrate in a "pads down" orientation, related electronics can be pre-printed or otherwise pre-deposited on the tag substrate.

In an aspect of the present invention, a radio frequency identification (RFID) tag antenna is formed. The antenna includes a first, a second, a third, and a fourth arm. Each of the arms is affixed to a substrate and extends radially from a central location to form a X-shaped structure. The antenna further includes a fifth, a sixth, a seventh, and an eighth arm. The fifth and sixth arms oppositely extend from the third arm. The seventh and eighth arms oppositely extend from the fourth arm. In this way, two smaller X-shaped structures are formed on two legs of the larger X-shaped structure.

Any number of one or more such antennas may be formed in an array in a web of tags.

These and other advantages and features will become readily apparent in view of the following detailed description of the invention.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
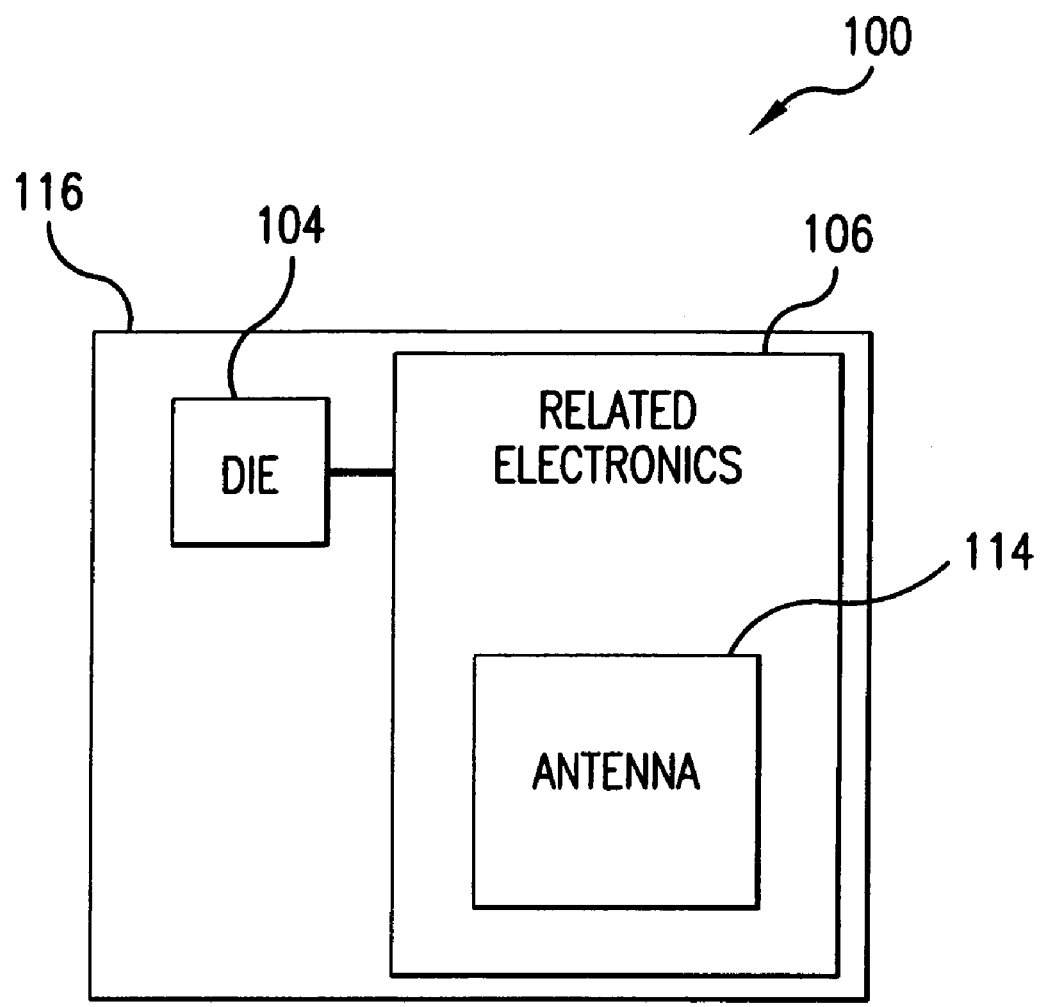
FIG. 1 shows a block diagram of an exemplary RFID tag, according to an embodiment of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The present invention provides improved processes and systems for assembling electronic devices, including RFID tags. The present invention provides improvements over current processes. Conventional techniques include vision-based systems that pick and place dies one at a time onto substrates. The present invention can transfer multiple dies simultaneously. Vision-based systems are limited as far as the size of dies that may be handled, such as being limited to dies larger than 600 microns square. The present invention is applicable to dies 100 microns square and even smaller. Furthermore, yield is poor in conventional systems, where two or more dies may be accidentally picked up at a time, causing losses of additional dies. The present invention allows for improved yield values. Badmash The present invention provides an advantage of simplicity. Conventional die transfer tape mechanisms may be used by the present invention. Furthermore, much higher fabrication rates are possible. Current techniques process 5-8 thousand units per hour. The present invention can provide improvements in these rates by a factor of N. For example, embodiments of the present invention can process dies 5 times as fast as conventional techniques, at 100 times as fast as conventional techniques, and at even faster rates. Furthermore, because the present invention allows for flip-chip die attachment techniques, wire bonds are not necessary.

Elements of the embodiments described herein may be combined in any manner. Example RFID tags are described in the section below. Assembly embodiments for RFID tags are described in the next section. Example applications for tags and tag assembly techniques are then described, followed by a description of example substrate webs and antenna layouts.

The present invention is directed to techniques for producing electronic devices, such as RFID tags. For illustrative purposes, the description herein primarily relates to the production of RFID tags. However, the description is also adaptable to the production of further electronic device types, as would be understood by persons skilled in the relevant art(s) from the teachings herein.

FIG. 1 shows a block diagram of an exemplary RFID tag 100, according to an embodiment of the present invention. As shown in FIG. 1, RFID tag 100 includes a die 104 and related electronics 106 located on a tag substrate 116. Related electronics 106 includes an antenna 114 in the present example. As is further described elsewhere herein, die 104 may be mounted in either a pads up or pads down orientation.

RFID tag 100 may be located in an area having a large number, population, or pool of RFID tags present. RFID tag 100 receives interrogation signals transmitted by one or more tag readers. According to interrogation protocols, RFID tag 100 responds to these signals. Each response includes information that identifies the corresponding RFID tag 100 of the potential pool of RFID tags present. Upon reception of a response, the tag reader determines the identity of the responding tag, thereby ascertaining the existence of the tag within a coverage area defined by the tag reader.

RFID tag 100 may be used in various applications, such as inventory control, airport baggage monitoring, as well as security and surveillance applications. Thus, RFID tag 100 can be affixed to items such as airline baggage, retail inventory, warehouse inventory, automobiles, compact discs (CDs), digital video discs (DVDs), video tapes, and other objects. RFID tag 100 enables location monitoring and real time tracking of such items.

In the present embodiment, die 104 is an integrated circuit that performs RFID operations, such as communicating with one or more tag readers (not shown) according to various interrogation protocols. Exemplary interrogation protocols are described in U.S. Pat. No. 6,002,344 issued Dec. 14, 1999 to Bandy et al. entitled System and Method for Electronic Inventory, and U.S. patent application Ser. No. 10/072,885, filed on Feb. 12, 2002, both of which are incorporated by reference herein in its entirety. Die 104 includes a plurality of contact pads that each provide an electrical connection with related electronics 106.

Related electronics 106 are connected to die 104 through a plurality of contact pads of IC die 104. In embodiments, related electronics 106 provide one or more capabilities, including RF reception and transmission capabilities, sensor functionality, power reception and storage functionality, as well as additional capabilities. The components of related electronics 106 can be printed onto a tag substrate 116 with materials, such as conductive inks. Examples of conductive inks include silver conductors 5000, 5021, and 5025, produced by DuPont Electronic Materials of Research Triangle Park, N.C. Other materials or means suitable for printing related electronics 106 onto tag substrate 116 include polymeric dielectric composition 5018 and carbon-based PTC resistor paste 7282, which are also produced by DuPont Electronic Materials of Research Triangle Park, N.C. Other materials or means that may be used to deposit the component material onto the substrate would be apparent to persons skilled in the relevant art(s) from the teachings herein.

As shown in FIG. 1, tag substrate 116 has a first surface that accommodates die 104, related electronics 106, as well as further components of tag 100. Tag substrate 116 also has a second surface that is opposite the first surface. An adhesive material or backing can be included on the second surface. When present, the adhesive backing enables tag 100 to be attached to objects, such as books and consumer products. Tag substrate 116 is made from a material, such as polyester, paper, plastic, fabrics such as cloth, and/or other materials such as commercially available Tyvec®.

In some implementations of tags 100, tag substrate 116 can include an indentation, "cavity," or "cell" (not shown in FIG. 1) that accommodates die 104. An example of such an implementation is included in a "pads up" orientation of die 104.

Figure 2B:
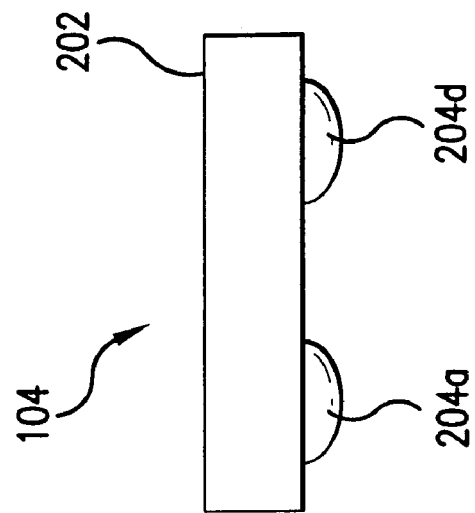
FIGS. 2A and 2B show plan and side views of an exemplary die, respectively.
Figure 2A:
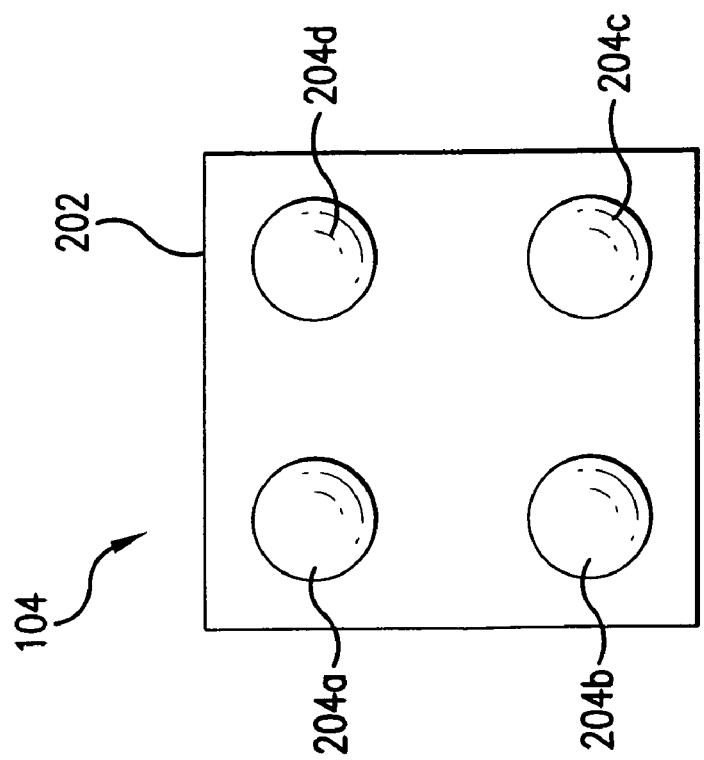

FIGS. 2A and 2B show plan and side views of an example die 104. Die 104 includes four contact pads 204a-d that provide electrical connections between related electronics 106 and internal circuitry of die 104. Note that although four contact pads 204a-d are shown, any number of contact pads may be used, depending on a particular application. Contact pads 204 are made of an electrically conductive material during fabrication of the die. Contact pads 204 can be further built up if required by the assembly process, by the deposition of additional and/or other materials, such as gold and solder flux. Such post processing, or "bumping," will be known to persons skilled in the relevant art(s).

Figure 2C:
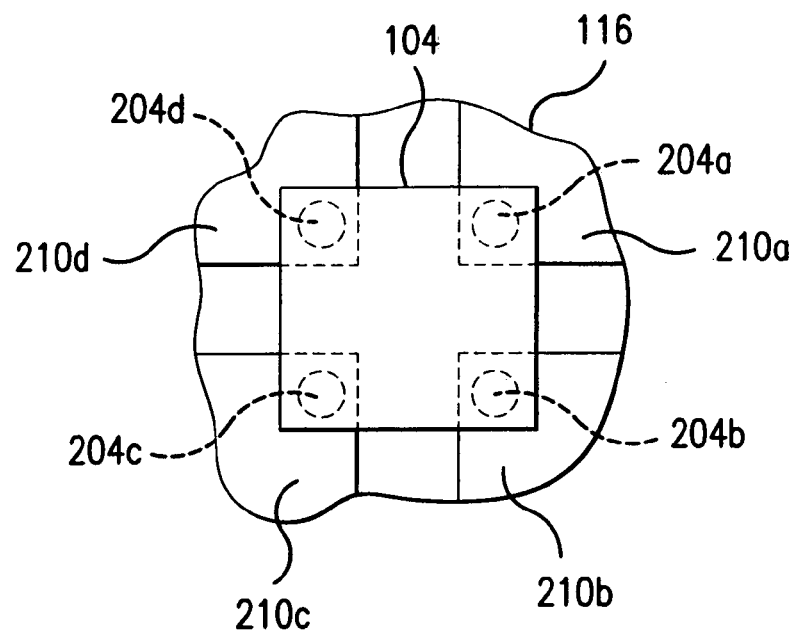
FIGS. 2C and 2D show portions of a substrate with a die attached thereto, according to example embodiments of the present invention.
Figure 2D:
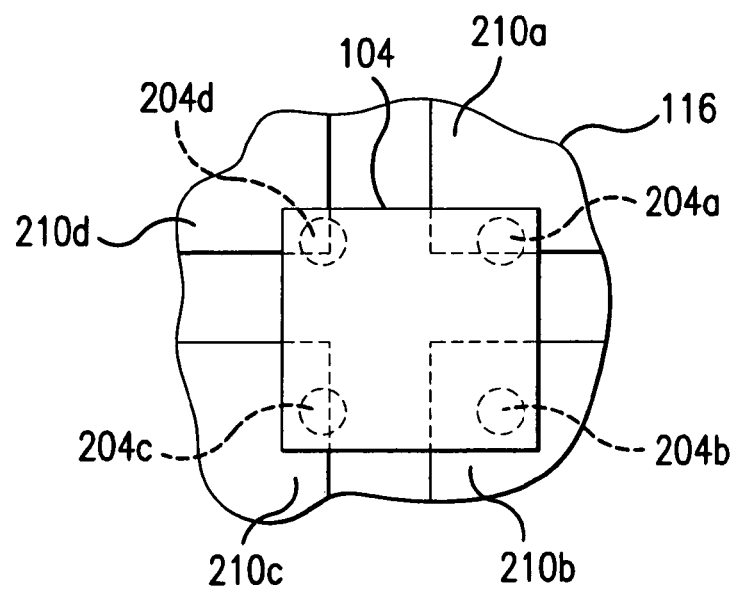

FIG. 2C shows a portion of a substrate 116 with die 104 attached thereto, according to an example embodiment of the present invention. As shown in FIG. 2C, contact pads 204a-d of die 104 are coupled to respective contact areas 210a-d of substrate 116. Contact areas 210a-d provide electrical connections to related electronics 106. The arrangement of contact pads 204a-d in a rectangular (e.g., square) shape allows for flexibility in attachment of die 104 to substrate 116, and good mechanical adherement. This arrangement allows for a range of tolerance for imperfect placement of IC die 104 on substrate 116, while still achieving acceptable electrical coupling between contact pads 204a-d and contact areas 210a-d. For example, FIG. 2D shows an imperfect placement of IC die 104 on substrate 116. However, even though IC die 104 has been improperly placed, acceptable electrical coupling is achieved between contact pads 204a-d and contact areas 210a-d.

Note that although FIGS. 2A-2D show the layout of four contact pads 204a-d collectively forming a rectangular shape, greater or lesser numbers of contact pads 204 may be used. Furthermore, contact pads 204a-d may be laid out in other shapes in embodiments of the present invention.

Figure 3:
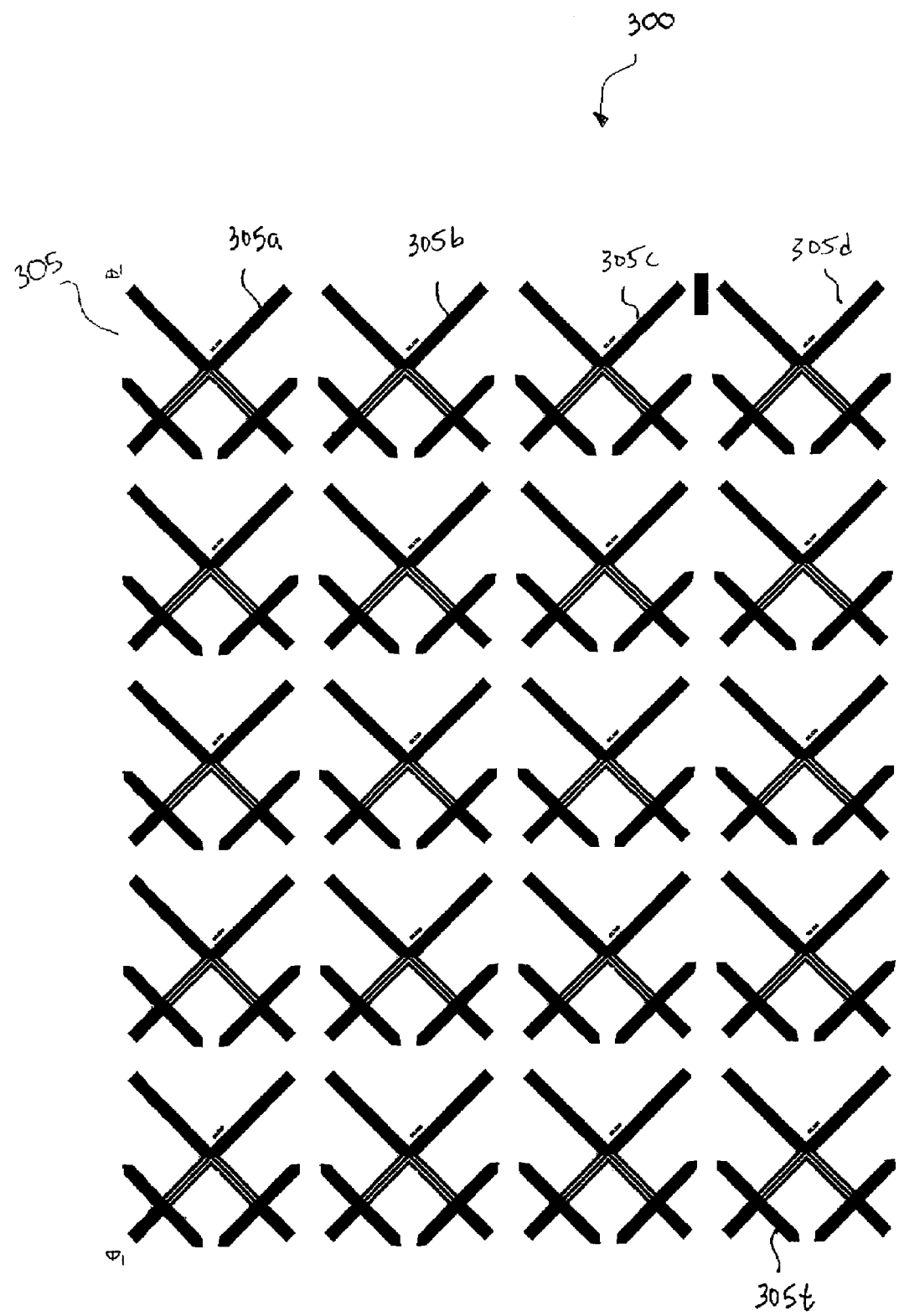
FIGS. 3-5 illustrate antenna and web configurations according to exemplary embodiments of the present invention.

FIG. 3 illustrates an antenna array or web 300 that includes a four by five array of antennas 305a-305t, although other sized arrays are also possible. Web 300 may be a complete web sheet, or may be a portion of a larger web. Antennas 305 can be made in any size. For example, a die pitch or spacing of antennas 305 can be 100 mm, or other amounts.

Figure 4:
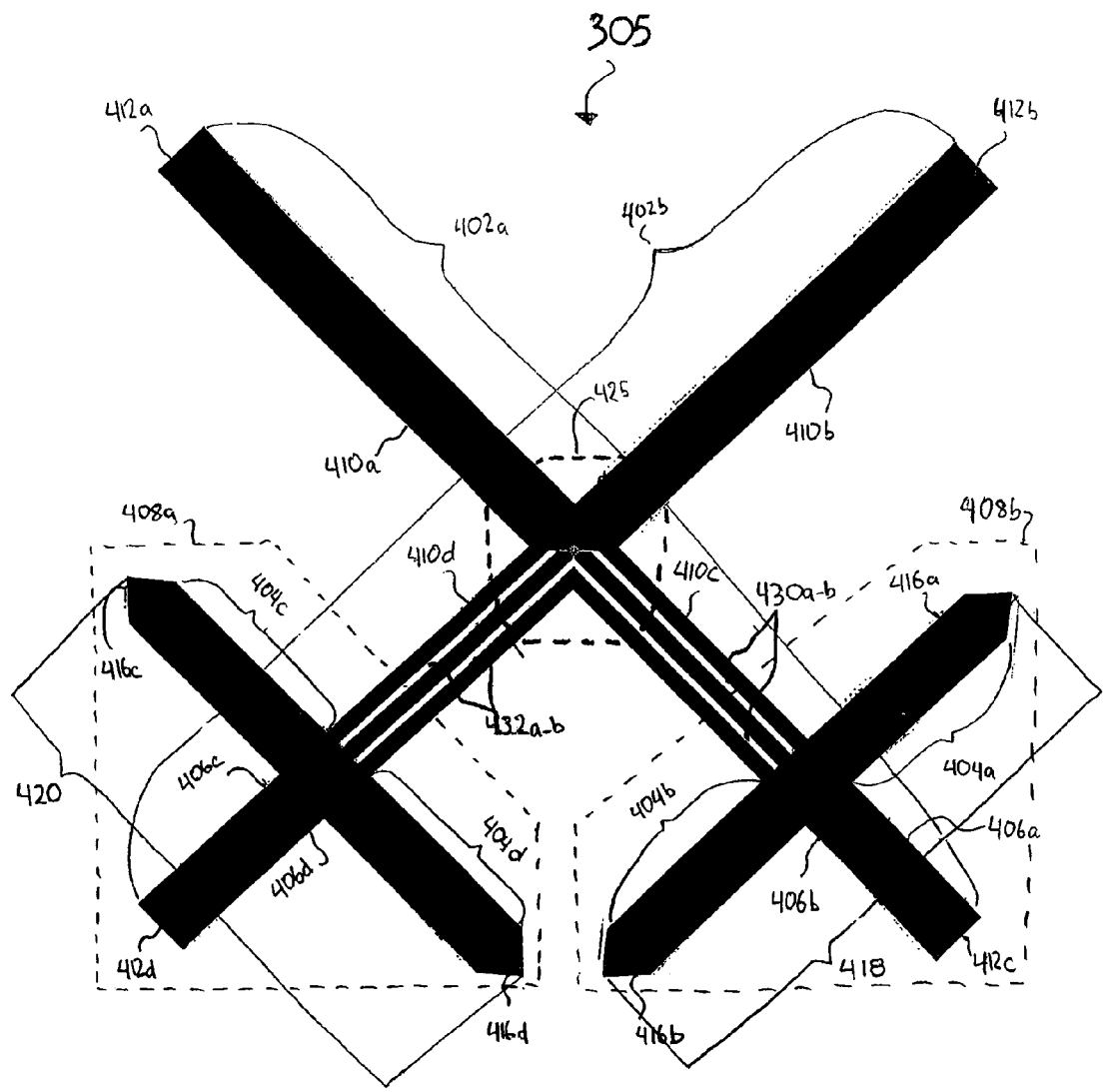

As shown in FIG. 4, antenna 305 is disposed on a rectangular substrate portion. Antenna 305 has first and second bar-shaped patterns 402a and 402b. The first and second bar-shaped patterns 402a-b intersect orthogonally to form a first X-shaped structure for antenna 305. Antenna 305 includes a third bar-shaped pattern 418. Third bar-shaped pattern 418 intersects first bar-shaped pattern 402a to form a second X-shaped pattern 408a. A location where pattern 418 intersects pattern 402a is at less than half the distance from an end 412c of pattern 402a to a central location in a central portion 425 of the first X-shaped structure. Antenna 305 includes a fourth bar-shaped pattern 420. Fourth bar-shaped pattern 420 intersects second bar-shaped pattern 402b to form a third X-shaped pattern 408b. A location where pattern 420 intersects pattern 402b is at less than half the distance from an end 412d of pattern 402b to the central location of the first X-shaped structure.

From another perspective, antenna 305 can be viewed as having four arms 410a-d radially extending from a center portion 425 of antenna 305 to form the first X-shaped structure for antenna 305. Two of the arms that are adjacent to each other each further includes two smaller arms extending therefrom. Specifically, in the example of FIG. 4, arm 410c includes an arm 404a extending from a first side 406a, and an arm 404b extending from a second opposing side 406b to form the third X-shaped pattern 408b. Arms 404a and 404b form third bar-shaped pattern 418. Similarly, arm 410d includes an arm 404c extending from a first side 406c and an arm 404d extending from a second opposing side 406d to form the second X-shaped pattern 408a. Arms 404c and 404d form fourth bar-shaped pattern 420. In this way, two smaller X-shaped structures 408a-b are formed in the third and fourth arms 410c-d of the first X-shaped structure formed by arms 410a-b.

As shown in FIG. 4, arms 410c and 410d both include a pair of parallel slots 430a-b and 432a-b extending along or portion of their respective lengths. In an embodiment, the pair of slots 430a-b begin from near a center location of the first X-shaped structure, where arms 410a-d intersect, and stop approximately at the start of a junction where arms 404a-b extend from arm 410c. Similarly, the pair of slots 432a-b start from near a center location of the first X-shaped structure, where arms 410a-d intersect, and end approximately at the start of a junction where arms 404c-d extend from arm 410d. Any number and length of slots may be present in one or more arms of antenna 305 as desired for a particular application.

As shown in FIG. 4, arms 410a-d have ends 412a-d, respectively. Ends 412a-d are shown as squared in FIG. 4, although they can have other shapes. Arms 404a-d have ends 416a-d, respectively. Ends 416a-d are shown as triangular shaped or pointed, in FIG. 4, but can have other shapes.

Arms 410a-d and 404a-d are elongated patterns made from an electrically conductive material suitable for use as an antenna material, such as conductive ink, or any other suitable material disclosed elsewhere herein or otherwise known to persons skilled in the relevant art(s).

Figure 5:
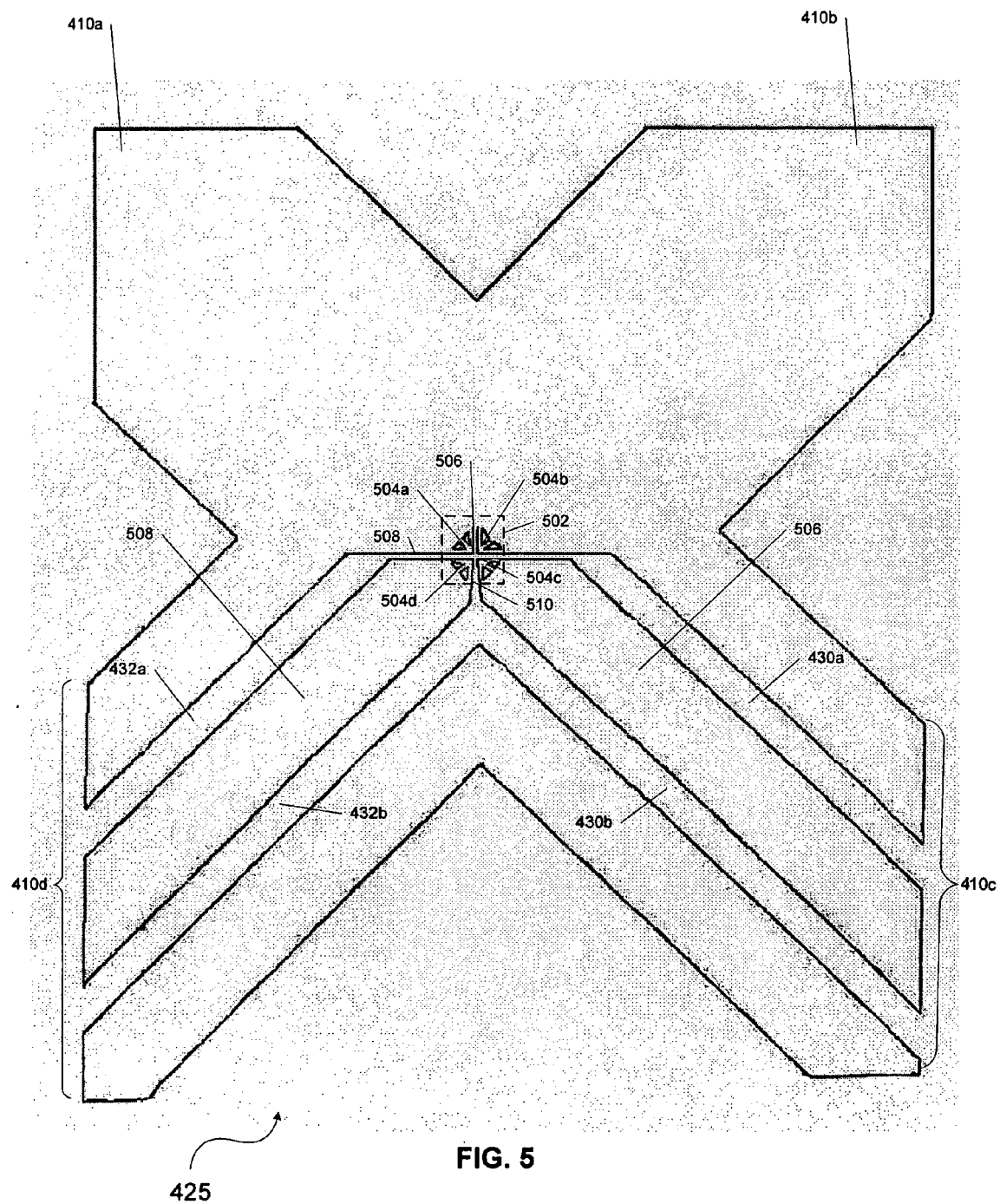

FIG. 5 illustrates a detailed view of center portion 425 shown in FIG. 4. Center portion 425 of antenna 305 has a die mounting position 502, for a die having four contact pads. When a die is present, each contact pad of the die is coupled to a respective pad coupled to one of arms 410a-d of antenna 305. Die mounting position 502 includes a first pad 504a, a second pad 504b, a third pad 504c, and a fourth pad 504d. As shown in FIG. 5, first pad 504a is located most closely to and is coupled to arm 410a. Second pad 504b is located most closely to and is coupled to arm 410b. A slot 506 separates first pad 504a and second pad 504b. Third pad 504c is coupled to a first end of an elongated pattern 506 of arm 410c located between slots 430a and 430b of arm 410c. Similarly, fourth pad 504d is coupled to a first end of an elongated pattern 508 of arm 410d located between slots 432a and 432b of arm 410c. A slot 508 is open between slot 430a and slot 432a, and separates first pad 504a from fourth pad 504d, and separates second pad 504b from third pad 504c. A slot 510 is open between a central location of slot 508 and an intersection of slots 430b and 432b.

As shown in FIG. 5, one or more of pads 504a-d may each have one or more openings. The openings allow UV light to pass through the respective pad(s) to cure an adhesive material that is used to attached a die to pads 504a-d.

CONCLUSION

While various embodiments of the present invention have been described above, it should be understood that they have been presented by way of example, and not limitation. It will be apparent to persons skilled in the relevant arts that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A radio frequency identification (RFID) tag antenna comprising:
    a first arm formed on a substrate;
    a second arm formed on the substrate;
    a third arm formed on the substrate;
    a fourth arm formed on the substrate, wherein the first, second, third and fourth arms extend radially from a central location;
    a fifth arm formed on the substrate;
    a sixth arm formed on the substrate, wherein the fifth and sixth arms extend from opposite sides of the third arm;
    a seventh arm formed on the substrate; and
    an eighth arm formed on the substrate, wherein the seventh and eighth arms extend from opposite sides of the fourth arm, wherein each forms a 90° angle with each adjacent arm.

2. The RFID tag antenna of claim 1, wherein the third arm has a length, the fifth and sixth arms intersect the third arm at more than half the length of the third arm from the central location.

3. The RFID tag antenna of claim 1, wherein the fourth arm has a length, the seventh and eighth arms intersect the fourth arm at more than half the length of the fourth arm from the central location.

4. The RFID tag antenna of claim 1, wherein the central location has a plurality of mounting pads for an IC die.

5. The RFID tag antenna of claim 4, further comprising:
    a first pair of parallel slots in the third arm extending along a portion of a length of the third arm; and
    a second pair of parallel slots in the fourth arm extending along a portion of a length of the fourth arm.

6. An antenna comprising:
    a first bar-shaped pattern formed on a substrate;
    a second bar-shaped pattern formed on the substrate, the first bar-shaped pattern intersects the second bar-shaped pattern at a central location;
    a third bar-shaped pattern formed on the substrate;

a fourth bar-shaped pattern formed on the substrate, wherein the third bar-shaped pattern intersects the first bar-shaped pattern between the central location and a first end of the first bar-shaped pattern, and wherein the fourth bar-shaped pattern intersects the second bar-shaped pattern between the central location and a second end of the second bar-shaped pattern;

a first pair of parallel slots in the first bar-shaped pattern extending along a portion of a length of the first bar-shaped pattern; and a second pair of parallel slots in the second bar-shaped pattern extending along a portion of a length of the second bar-shaped pattern.

7. The antenna of claim 6, wherein the third bar-shaped pattern intersects the first bar-shaped pattern at less than half a length from an end of the first bar-shaped pattern to the central location.

8. The antenna of claim 6, wherein the fourth bar-shaped pattern intersects the second bar-shaped pattern at less than half a length from an end of the second bar-shaped pattern to the central location.

9. The antenna of claim 6, wherein the first and second bar-shaped pattern are perpendicular to each other.

10. The antenna of claim 6, wherein the central location comprises a plurality of pads for mounting an IC die.

* * * * *